(12) United States Patent
Kim et al.

(10) Patent No.: US 10,429,439 B2
(45) Date of Patent: Oct. 1, 2019

(54) IN DIE STEPPING SORT

(71) Applicant: Intel Corporation, Santa Clara, CA (US)

(72) Inventors: Dae-Woo Kim, Phoenix, AZ (US); J. Daniel Bryan, Aloha, OR (US); Joseph W. Parks, Jr., Aloha, OR (US); Ethan Caughey, Hillsboro, OR (US); Mark W. Dryfuse, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 578 days.

(21) Appl. No.: 15/201,315

(22) Filed: Jul. 1, 2016

(65) Prior Publication Data

US 2018/0003765 A1 Jan. 4, 2018

(51) Int. Cl.
*G01R 31/28* (2006.01)
*G01R 31/26* (2014.01)
*H01L 23/538* (2006.01)
*G01R 1/073* (2006.01)

(52) U.S. Cl.
CPC ..... *G01R 31/2886* (2013.01); *G01R 1/07378* (2013.01); *G01R 31/2601* (2013.01); *G01R 31/2889* (2013.01); *H01L 23/5386* (2013.01)

(58) Field of Classification Search
CPC ............ G01R 31/2886; G01R 1/07378; G01R 31/2601; G01R 31/2889; H01L 23/5386
USPC ...................... 324/500, 600, 754.01–754.03, 324/754.07–754.12, 755.01, 756.03, 324/758.01, 690, 696, 715, 724
See application file for complete search history.

(56) References Cited

U.S. PATENT DOCUMENTS

| 2003/0038652 | A1 | 2/2003 | McGough et al. |
| 2012/0169367 | A1* | 7/2012 | Kuo .................. G01R 1/06772 324/756.03 |
| 2012/0319711 | A1 | 12/2012 | Hung et al. |
| 2014/0070380 | A1 | 3/2014 | Chiu |
| 2014/0091819 | A1 | 4/2014 | Gong et al. |
| 2014/0235027 | A1 | 8/2014 | Hamel |
| 2015/0359100 | A1* | 12/2015 | Zhao .................. H01L 25/0652 361/783 |

FOREIGN PATENT DOCUMENTS

WO     2018005007     1/2018

OTHER PUBLICATIONS

"International Application Serial No. PCT/US2017/035797, International Search Report dated Aug. 2, 2017", 3 pgs.
"International Application Serial No. PCT/US2017/035797, Written Opinion dated Aug. 2, 2017", 8 pgs.

* cited by examiner

*Primary Examiner* — Melissa J Koval
*Assistant Examiner* — Trung Nguyen
(74) *Attorney, Agent, or Firm* — Schwegman Lundberg & Woessner, P.A.

(57) ABSTRACT

An apparatus for testing a die can comprise a first printed circuit board (PCB), a space transformer, and a plurality of probes. The first PCB can be configured to connect to a second PCB. The space transformer can be attached to the PCB. The space transformer can include a plurality of traces. Each of the plurality of probes can be connected to one of the plurality of traces.

19 Claims, 5 Drawing Sheets

IN DIE STEPPING SORT

TECHNICAL FIELD

Embodiments described generally herein relate to microelectronic packages. More particularly, embodiments described generally herein relate to testing electrical connections within microelectronic packages.

BACKGROUND

Microelectronics generally include a central processing unit (CPU). In order to enhance performance, CPU products are increasingly integrating multiple dies within the CPU package in a side-by-side or other multi-chip module (MCM) format. An embedded multi-die interconnect bridge (EMIB) is a way to electrically connecting multiple dies within a microelectronic package.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

An embedded multi-die interconnect bridge (EMIB) is a technology solution for dense multichip packaging using a very thin silicon (Si) bridge for interconnecting two different input/output (I/O) blocks (e.g., dies). Si bridges can utilize a pitch smaller than 65 μm to enable extremely high density of I/O per mm. Currently technology to test bridges does not allow for testing pitches less than 65 μm. As disclosed herein, the testing of tight pitches can be accomplished using Si level design with blocks of a repeatable pattern. For example, a tester can test the each block of the repeatable pattern and step within a die to test the entire die.

Figure 1:
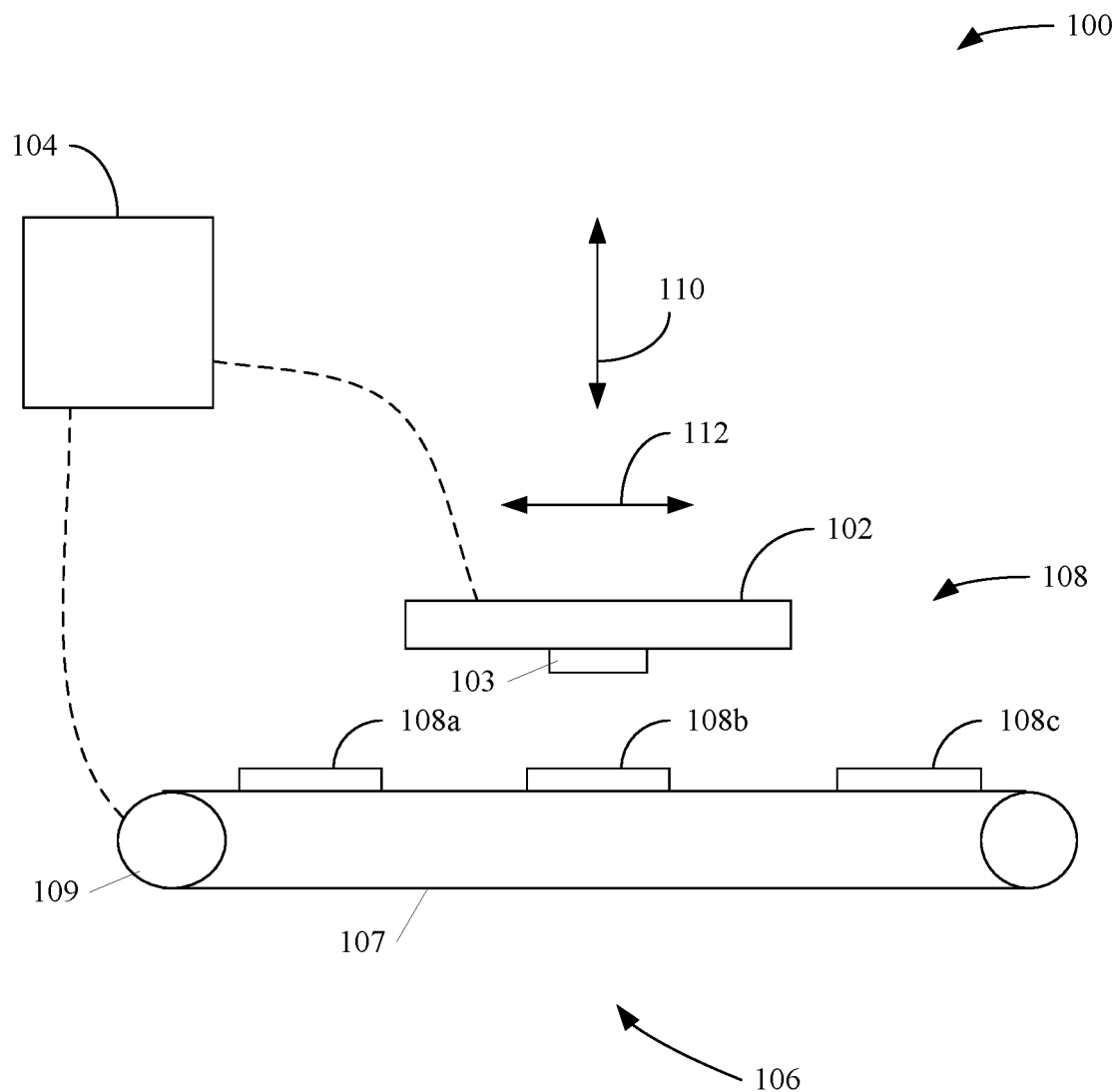
FIG. 1 illustrates a block diagram of a system for testing a die in accordance with some embodiments disclosed herein.

Turning now to the figures, FIG. 1 illustrates a block diagram of a system 100 for testing a die in accordance with some embodiments disclosed herein. The system 100 can include a test head 102 with a probe carrier 103, a computing device 104, and a conveyer 106. As disclosed herein, dies can be tested as in-tact wafer form. Stated another way, a wafer containing multiple dies can be stepped beneath the test head 102 such that individual bumps within a die can be tested. The conveyer 106, or other mechanism for maneuvering the dies, can be used to position a plurality of dies 108 (e.g., first die 108a, second die 108b, and third die 108c) proximate the test head 102. In the example shown, the conveyor 106 includes a belt 107, and one or more rollers 109.

Figure 2:
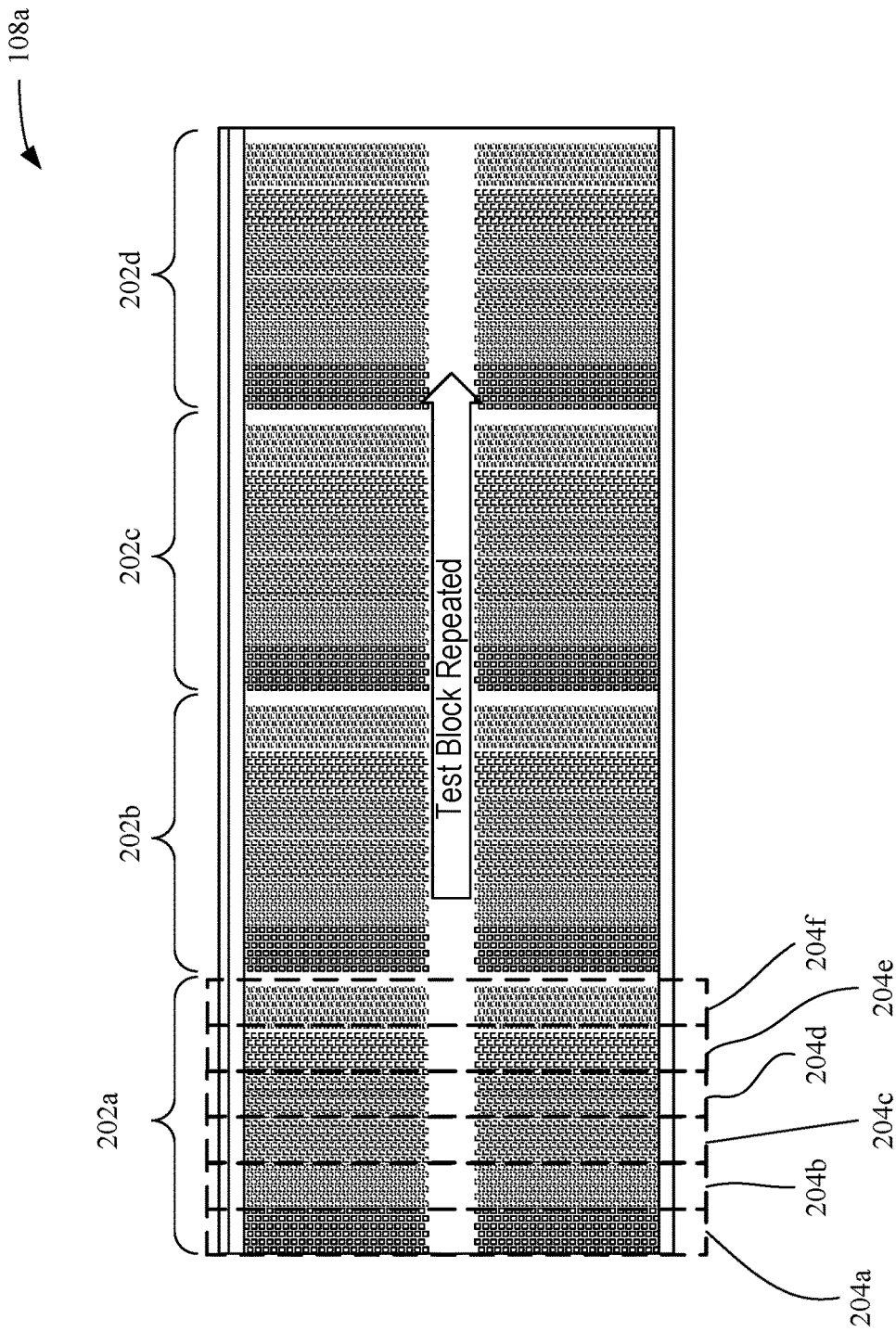
FIG. 2 illustrates a die in accordance with some embodiments disclosed herein.

FIG. 2 illustrates one of the plurality of dies (e.g., the first die 108a) in accordance with some embodiments disclosed herein. As shown in FIG. 2, the first die 108a can be a collection of dies prior to separation into individual dies. Stated another way, the first die 108a can include die 202a, die 202b, die 202c, and die 202d (collectively dies 202) after they have been manufactured but before they have been separated into individual dies.

As shown in FIG. 2, each of the dies 202 can have a plurality of repeatable blocks (e.g., a first block 204a, second block 204b, third block 204c, fourth block 204d, fifth block 204e, and sixth block 204f). The repeatable blocks 204 can have the same bump pitch and bump pattern. Thus, as disclosed herein, the test head 102 can step through each of the repeatable blocks 204 and test continuity of each of the repeatable blocks 204 of each of the dies 202.

FIG. 2 can also be a single die. For example, a single die can have multiple repeating patterns as shown in FIG. 2. As such, the single die can be stepped through and testing using the systems and methods disclosed herein. For instance, reference numerals 202a, 202b, 202c, and 202d can refer to various portions of a single die that have repeating patterns 204a-204f. As such, each of the repeating patterns 204a-204f can be testing using the systems and methods disclosed herein.

Returning to FIG. 1, the computing device 104 can be in electrical communication with the test head 102 and the conveyer 106. The computing device 104 can transmit signals to the test head 102 and receive signals from the test head 102. For example, the computing device 104 can transmit a signal to the test head 102 that can cause the test head 102 to apply a current across each trace of a die. In response to applying the current, the computing device 104 can receive a voltage signal from the test head 102. The voltage signal or lack of the voltage signal can indicate a fault within a trace of the die. For example, a short or broken trace may return a voltage of zero, thereby indicating a fault.

In addition, the computing device can be used to control movement of the test head 102. For example, as the dies 108 are positioned underneath the test head 102, the computing device 104 can transmit a signal to translate the test head 102 as indicated by arrow 110 such that a portion of the test head 102 contacts the various bumps of the die for testing. In addition, in various embodiments, the computing device 104 can cause translation of the test head 102 as indicated by arrow 112 to reposition the test head 102 proximate one of the dies 108.

Furthermore, the computing device 104 can control the conveyer 106. For example, the computing device 104 can transmit signals to the conveyer 106 to cause the conveyer 106 to reposition the dies 108 such that the dies 108 are underneath the test head 102.

Figure 3:
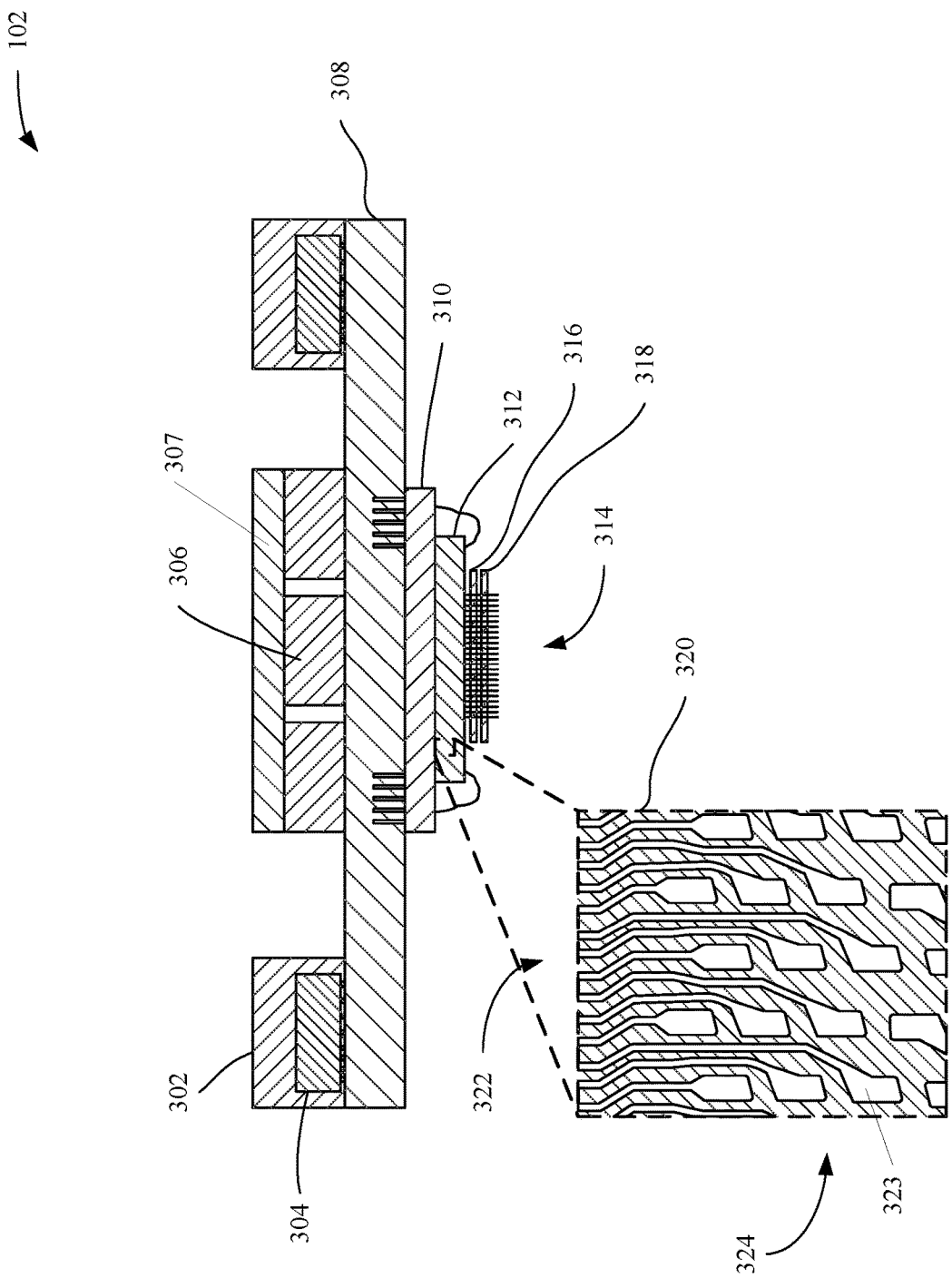
FIG. 3 illustrates a test head in accordance with some embodiments disclosed herein.

Turning now to FIG. 3, FIG. 3 illustrates the test head 102 in accordance with some embodiments disclosed herein. More specifically, FIG. 3, illustrates a sectional view of the test head 102 in accordance with some embodiments disclosed herein. The test head 102 can include a stiffener ring 302, a tester connector 304, a contact force locator 306, a contact force planarizer 307, a printed circuit board (PCB) 308, a second PCB 310, a space transformer 312, a plurality of probes 314, a first guide plate 316, and a second guide plate 318.

The stiffener ring 302 can provide structural rigidity to the test head 102. For example, as the test head 102 is lowered to contact the dies 108, the stiffener ring 302 can help support the test head 102 and minimize deformation of the test head 102. The stiffener ring 302 can be manufactured from polymers, metals, ceramics, or combinations thereof and using techniques such as, but not limited to, machining, injection molding, over molding, etc.

The tester connector 304 can allow the test head 102 to be connected to the computing device 104. The tester connector 304 can allow signals to be transferred between the computing device 104 and the test head 102. Examples of the tester connector 304 include, but not limited to, serial ports, parallel ports, universal serial bus (USB) ports, Ethernet ports, etc.

The contact force locator 306 can transmit and absorb a force applied by the test head 102 to the dies 108. The contact force locator 306 can be manufactured from metals and ceramics and manufactured using machining techniques. For example, the contact force locator 306 can be machined from a steel ingot.

The first PCB 308 can allow the second PCB 310 to communicate with the tester connector 304. The first PCB 308 can include traces that are spaced on a mm order of magnitude. The second PCB 310 can include traces that step down in order of magnitude. For example, the space transformer 312 can connect to the plurality of probes 314. The plurality of probes can have a pitch that ranges between about 35 microns to about 100 microns. To jump from a micron order of magnitude to a mm order of magnitude may require more than one step. As a result, the space transformer 312 can be an intermediary order of magnitude. In addition, multiple space transformers and PCBs can be used depending on the order of magnitude jump between the pitch of plurality of probes 314 and the traces of the first PCB 308.

As shown in the detail 320, the space transformer 312 can include a plurality of traces 322. The traces can connect to the plurality of probes 314. The traces 322 can fan out to pads 324 (including individual pad 323) to allow the space transformer 312 to connect to circuitry of the second PCB 310. For example, the pitch of the traces 322 can be less than 65 microns and the pads 324 can fan out to an order of magnitude between 100 and 500 microns. This can allow the space transformer 312 to act as an order of magnitude intermediary between the plurality of probes 314 and the second PCB 310.

The PCB 310 can be a permanent fixture of the test head 102 and the second PCB 310 and space transformer 312 can be modular components that can be replaced with different PCBs and space transformers for different bump patterns and different dies. The space transformer 312 can be wire bonded to the second PCB 310. As result, the space transformer 312 can also be modular with respect to the second PCB 310.

The plurality of probes 314 and the space transformer 312 can be manufactured via a MEMS process. For example, the plurality of probes 314 can be formed via a MEMS process and the traces 322 within the space transformer 312 can be formed via a MEMS process such that the traces 322 electrically connect the plurality of probes 314 to the pads 324 and the second PCB 310.

In addition, the plurality of probes 314 can be reinforced using the first guide plate 316 and the second guide plate 318. For example, the plurality of probes 314 can have a length ranging from about 0.25 mm to about 2 mm from the guide plate to a tip of the probes 314. For instance, the first guide plate 316 and the second guide plate 318 can be included with probes over a certain length (e.g., 1 mm) such that during contact with the dies 108, the plurality of probes 314 remain in position and do not bend or buckle under the force exerted via the contact force locator 306.

Figure 4:
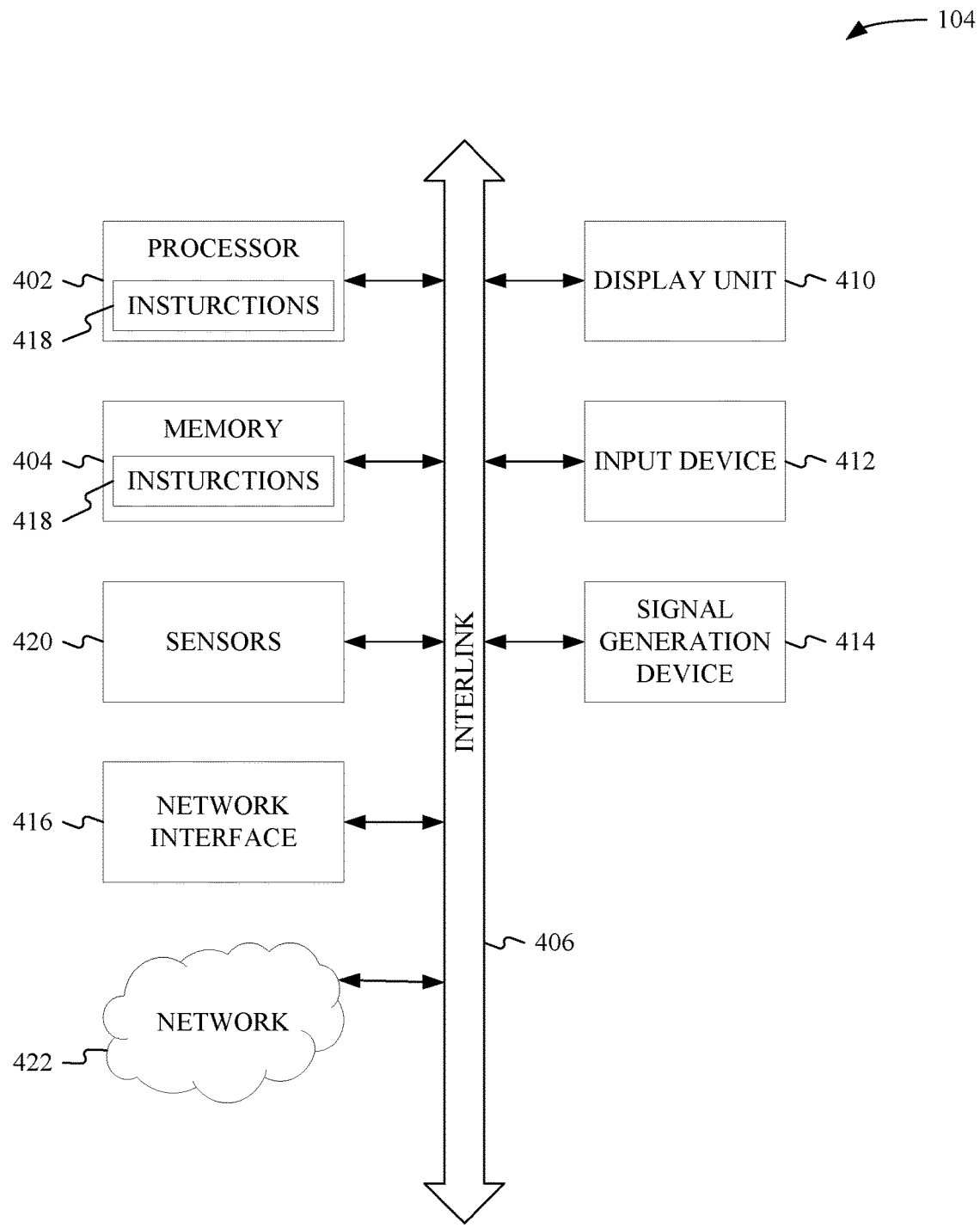
FIG. 4 illustrates a block diagram of a computing device in accordance with some embodiments disclosed herein.

FIG. 4 illustrates a block diagram of the computing device 104 according to some embodiments disclosed herein. The computing device 104 can be used to execute any methods disclosed herein.

Examples, as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, at least a part of one or more computer systems (e.g., a standalone, client or server computer system) or one or more hardware processors 402 may be configured by firmware or software (e.g., instructions, an application portion, or an application) as a module that operates to perform specified operations, such as those described herein with respect to FIG. 5. In an example, the software may reside on a non-transitory computer readable medium. In an example, the software, when executed by the underlying hardware of the module, causes the hardware to perform the specified operations as disclosed herein.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform at least part of any operation described herein. Considering examples in which modules are temporarily configured, a module need not be instantiated at any one moment in time. For example, where the modules comprise a general-purpose hardware processor 402 configured using software; the general-purpose hardware processor may be configured as respective different modules at different times. Software may accordingly configure a hardware processor, for example, to constitute a particular module at one instance of time and to constitute a different module at a different instance of time. The term "application," or variants thereof, is used expansively herein to include routines, program modules, programs, components, and the like, and may be implemented on various system configurations, including single-processor or multiprocessor systems, microprocessor-based electronics, single-core or multi-core systems, combinations thereof, and the like. Thus, the term application may be used to refer to an embodiment of software or to hardware arranged to perform at least part of any operation described herein.

The computing device 104 may include a hardware processor 402 (e.g., a central processing unit (CPU), a graphics processing unit (GPU), a hardware processor core, or any combination thereof), and memory 404. The processor 402 and memory 404 together may be referred to as a controller. The various elements of the computing device 104 may communicate with each other over an interlink (i.e., bus) 406.

The computing device 104 may further include a display unit 410 and an input device 412 (e.g., a keypad) coupled to the interlink 406. In an example, the display unit 410 and the input device 412 together may be a touchscreen display. The touchscreen display may be mounted on proximate the test head 102 or in a remote location such as a manufacturing control room.

The computing device 104 may additionally include a signal generation device 414 as another feedback device (e.g., a speaker), a network interface device 416, and one or more sensors 420. As described herein, the sensors may include accelerometers, compasses, gyroscopes, altimeters, barometers, thermometers, and speed sensors located in one or more locations of the system (e.g., the test head 102, the conveyer 106).

The memory 404 may include at least one transitory or non-transitory computer-readable medium on which is stored one or more sets of data structures or instructions 418 (e.g., software) embodying or utilized by any one or more of the techniques, methods, or functions described herein. The instructions 418 may also reside, at least partially, in additional computer-readable memories such within the hardware processor 402 during execution thereof by the computing device 104. In an example, one or any combination of the hardware processor 402 or the memory 404 may constitute non-transitory computer-readable media.

The network interface device 416 may also be a sensor interface and include any wired or wireless interface, such as a radio, for reading sensors over a wireless channel. For example, the sensor interface may be a feedback device interface that communicates with remote sensors or feedback devices to collect data or transmit feedback signals to at least one of the test head 102, via the tester connector 304, and the conveyer 106. The network interface device 416 may also allow for communications via a network 42 (e.g., the Internet or an Ethernet).

Figure 5:
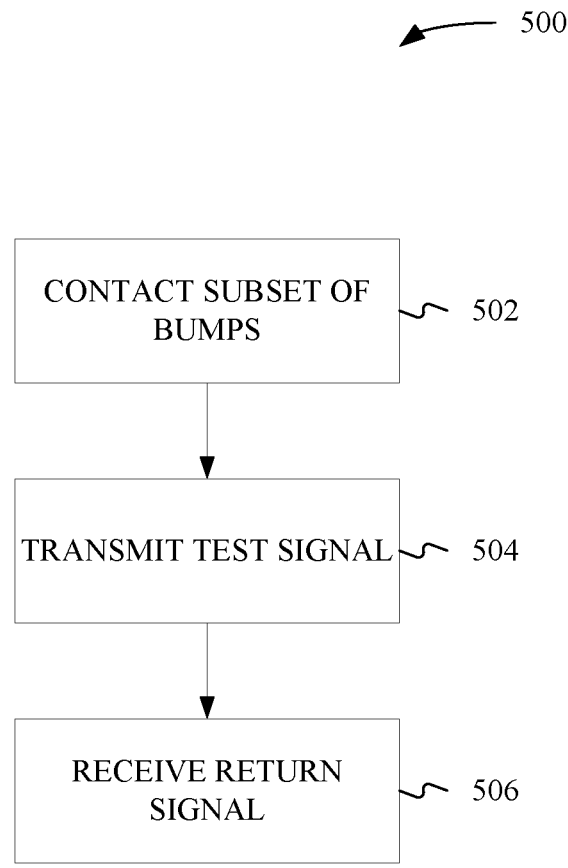
FIG. 5 illustrates method for testing a die in accordance with some embodiments disclosed herein.

FIG. 5 illustrates a method 500 for testing the dies 108 in accordance with some embodiments disclosed herein. The method 500 can begin at stage 502 where a subset of a plurality of bumps can be contacted with a plurality of probes. For example, the first block 204a can be contacted with the plurality of probes 314. As discussed herein, the first block 204a can have a bump pitch less than 100 microns. For instance, the bump pitch can be 65 microns.

From stage 502, the method 500 can proceed to stage 504 where a test signal can be transmitted. For example, the computing device 104 can transmit the test signal through the test head 102 into a die. The test signal can include applying a current across the traces within the die. The test signal can test continuity and losses within the die. For instance, the test signal can be used to determine if any of the traces have a short or a break.

From stage 504, the method 500 can proceed to stage 506 where a return signal can be received. For example, when a current is applied to each of the traces, a voltage can be read via the test head 102. The voltage can indicate loss or shorts within the die. For traces that are broken a voltage may not be able to be read. As a result, the return signal can be a zero voltage.

Once a first subset of bumps is tested, the die can be advanced using the conveyer 106 such that a second subset (e.g., the second block 204b) is underneath the test head 102. Once the die is repositioned, the method 500 can be repeated to test the second subset up bumps. Stated other way, the method 500 can continuously be repeated to test each subset of bumps within a die.

In addition, the method 500 can include providing a second test head having a second plurality of probes. The second plurality of probes can be arranged in a second bump pattern having a second bump pitch. For example, the second bump pitch can be less than 100 microns or less than 65 microns. The second bump pattern can correspond to a second subset of the plurality of bumps of the die. In addition, the second pump pattern can correspond to a second die.

ADDITIONAL NOTES & EXAMPLES

Example 1 includes an apparatus for testing a die. The apparatus can comprise a first printed circuit board (PCB), a space transformer, and a plurality of probes. The first PCB can be configured to connect to a second PCB. The space transformer can be attached to the first PCB. The space transformer can include a plurality of traces. Each of the plurality of probes can be connected to one of the plurality of traces. The plurality of probes can be arranged in a pattern having a pitch less than 65 microns.

In Example 2, the apparatus of Example 1 can optionally include at least one guide plate arranged to reinforce the plurality of probes.

In Example 3, the apparatus of any one of or any combination of Examples 1 and 2 can optionally include each of the plurality of probes having a length ranging from about 0.25 mm to about 2 mm.

In Example 4, the apparatus of any one of or any combination of Examples 1-3 can optionally include the pattern corresponding to a subsection of a pattern of the die.

In Example 5, the apparatus of any one of or any combination of Examples 1-4 can optionally include the die being an embedded multi-die interconnect bridge.

Example 6 can include an apparatus for testing a plurality of dies. Each of the plurality of dies can have a plurality of bumps. The apparatus can comprise a test head, a processor, and a memory. The test head can have a plurality of probes. Each of the plurality of probes can be connected to one of a plurality of traces of a space transformer. The plurality of probes can be arranged in a pattern having a pitch less than 65 microns. The memory can store instructions that, when executed by the processor, cause the processor to: actuate the test head such that the plurality of probes contact a subset of the plurality of bumps of one of the plurality of dies, and receive a voltage signal from the plurality of probes when the plurality of probes is in contact with the subset of the plurality of bumps of the one of the plurality of dies.

In Example 7, the apparatus of Example 6 can optionally include at least one guide plate arranged to reinforce the plurality of probes.

In Example 8, the apparatus of any one of or any combination of Examples 6 and 7 can optionally include each of the plurality of probes having a length ranging from about 0.25 mm to about 2 mm.

In Example 9, the apparatus of any one of or any combination of Examples 6-8 can optionally include a conveyer configured to reposition each of the dies proximate the test head.

In Example 10, the apparatus of any one of or any combination of Examples 6-9 can optionally include a second test head having a second plurality of probes. Each of the second plurality of probes can be connected to one of a second plurality of traces of a second space transformer. The second plurality of probes can be arranged in a second pattern having a second pitch less than 65 microns. The second pattern can correspond to a second subset of the plurality of bumps of the one of the plurality of dies.

In Example 11, the apparatus of any one of or any combination of Examples 6-10 can optionally include the die being an embedded multi-die interconnect bridge.

Example 12 can include a method of testing a plurality of dies having a plurality of bumps. The method can comprise contacting a first subset of the plurality of bumps with a plurality of probes of a test head including the plurality of probes arranged in a pattern having a pitch less than 65 microns; transmitting, via the test head, a test signal through each of a plurality of traces within the die; and receiving, at a computing device from the test head, a return signal indicating a continuity state of a plurality of traces, each of the plurality of traces connecting a pair of bumps of the subset of bumps.

In Example 13, the method of Example 12 can optionally include the test head further comprising at least one guide plate arranged to reinforce the plurality of probes.

In Example 14, the method of any one of or any combination of Examples 12 and 13 can optionally include each of the plurality of probes having a length ranging from about 0.25 mm to about 2 mm.

In Example 15, the method of any one of or any combination of Examples 12-14 can optionally include applying a test current across each of the pair of bumps.

In Example 16, the method of any one of or any combination of Examples 12-15 can optionally include receiving the signal including detecting a voltage signal at each of the pair of bumps of the subset of bumps.

In Example 17, the method of any one of or any combination of Examples 12-16 can optionally include contacting a second subset of bumps. The second subset of bumps can have a pattern that is the same as the pattern of the subset of bumps.

In Example 18, the method of any one of or any combination of Examples 12-16 can optionally include contacting a second subset of bumps with a second plurality of probes of a second test head. The second plurality of probes can be arranged in a second pattern having a second pitch less than 65 microns. The second pattern can correspond to a second subset of the plurality of bumps.

In Example 19, the apparatus of any one of or any combination of Examples 12-18 can optionally include the die being an embedded multi-die interconnect bridge.

Example 20 can include an apparatus for testing a plurality of dies. Each of the plurality of dies can have a plurality of bumps. The apparatus can comprise means for contacting a subset of the plurality of bumps of one of the plurality of dies, the contacting means including a plurality of probes arranged in a pattern having a pitch less than 65 microns; and means for receiving a test signal from the contacting means when the contacting means is in contact with the subset of the plurality of bumps.

In Example 21, the apparatus of Example 20 can optionally include means for reinforcing the plurality of probes.

In Example 22, the apparatus of any one of or any combination of Examples 20 and 21 can optionally include each of the plurality of probes having a length ranging from about 0.25 mm to about 2 mm.

In Example 23, the apparatus of any one of or any combination of Examples 20-22 can optionally include means for repositioning the subset of the plurality of bumps of each of the plurality of dies proximate the means for contacting the subset of the plurality of bumps.

In Example 24, the apparatus of any one of or any combination of Examples 20-23 optionally including a second means for contacting a second subset of the plurality of bumps. The second contacting means can include a second plurality of probes arranged in a second pattern having a second pitch less than 65 microns. The second pattern can correspond to the second subset of the plurality of bumps of the one of the plurality of dies.

In Example 25, the apparatus of any one of or any combination of Examples 20-24 can optionally include the die being an embedded multi-die interconnect bridge.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. An apparatus for testing a plurality of dies, each of the plurality of dies having a plurality of bumps, the apparatus comprising:
   a test head having a plurality of probes, each of the plurality of probes connected to one of a plurality of traces of a space transformer, the plurality of probes arranged in a pattern having a pitch less than 65 microns;
   a processor; and
   a memory storing instructions that, then executed by the processor, cause the processor to:

actuate the test head such that the plurality of probes contact a subset of the first plurality of bumps of one of the plurality of dies, and receive a voltage signal from the plurality of probes when the plurality of probes is in contact with the subset of the plurality of bumps of the one of the plurality of dies, wherein the plurality of dies is an embedded multi-die interconnect bridge.

2. The apparatus of claim 1, further comprising at least one guide plate arranged to reinforce the plurality of probes.

3. The apparatus of claim 1, wherein each of the plurality of probes has a length ranging from about 0.25 mm to about 2 mm.

4. The apparatus of claim 1, further comprising a conveyer configured to reposition each of the dies proximate the test head.

5. The apparatus of claim 1, further comprising a second test head having a second plurality of probes, each of the second plurality of probes connected to one of a second plurality of traces of a second space transformer, the second plurality of probes arranged in a second pattern having a second pitch less than 65 microns, the second pattern corresponding to a second subset of the plurality of bumps of the one of the plurality of dies.

6. A method of testing a plurality of dies having a plurality of bumps, the method comprising:

contacting a first subset of the plurality of bumps with a plurality of probes of a test head including the plurality of probes arranged in a pattern having a pitch less than 65 microns;

transmitting, via the test head, a test signal through each of a plurality of traces within the die;

receiving, at a computing device from the test head, a return signal indicating a continuity state of a plurality of traces, each of the plurality of traces connecting a pair of bumps of the subset of bumps; and contacting a second subset of bumps with a second plurality of probes of a second test head, the second plurality of probes arranged in a second pattern having a second pitch less than 65 microns, the second pattern corresponding to a second subset of the plurality of bumps.

7. The method of claim 6, further comprising applying a test current across each of the pair of bumps.

8. The method of claim 6, wherein receiving the signal includes detecting a voltage signal at each of the pair of bumps of the subset of bumps.

9. The method of claim 6, further comprising contacting a second subset of bumps, the second subset of bumps having a pattern that is the same as the pattern of the subset of bumps.

10. An apparatus for testing a plurality of dies, each of the plurality of dies having a plurality of bumps, the apparatus comprising:

means for contacting a subset of the plurality of humps of one of the plurality of dies, the contacting means including a plurality of probes arranged in a pattern having a pitch less than 65 microns; and means for receiving a test signal from the contacting means when the contacting means is in contact with the subset of the plurality of bumps, wherein the plurality of dies is an embedded multi-die interconnect bridge.

11. The apparatus of claim 10, further comprising means for reinforcing the plurality of probes.

12. The apparatus of claim 10, wherein each of the plurality of probes has a length ranging from about 0.25 mm to about 2 mm.

13. The apparatus of claim 10, further comprising means for repositioning the subset of the plurality of bumps of each of the plurality of dies proximate the means for contacting the subset of the plurality of bumps.

14. The apparatus of claim 10, further comprising a second means for contacting a second subset of the plurality of bumps, the second contacting means including a second plurality of probes arranged in a second pattern having a second pitch less than 65 microns, the second pattern corresponding to the second subset of the plurality of bumps of the one of the plurality of dies.

15. An apparatus for testing a plurality of dies, each of the plurality of dies having a plurality of bumps, the apparatus comprising:

a first test head having a first plurality of probes, each of the first plurality of probes connected to one of a first plurality of traces of a first space transformer, the first plurality of probes arranged in a first pattern having a first pitch less than 65 microns;

a second test head having a second plurality of probes, each of the second plurality of probes connected to one of a second plurality of traces of a second space transformer, the second plurality of probes arranged in a second pattern having a second pitch less than 65 microns, the second pattern corresponding to a second subset of the plurality of bumps of the one of the plurality of dies;

a processor; and a memory storing instructions that, when executed by the processor, cause the processor to:

actuate the first test head such that the first plurality of probes contact a first subset of the first plurality of bumps of one of the plurality of dies, receive a first voltage signal from the first plurality of probes when the first plurality of probes is in contact with the first subset of the plurality of bumps of the one of the plurality of dies, actuate the second test head such that the second plurality of probes contact a second subset of the second plurality of bumps of one of the plurality of dies, and receive a second voltage signal from the second plurality of probes when the second plurality of probes is in contact with the second subset of the plurality of bumps of the one of the plurality of dies.

16. The apparatus of claim 15, further comprising at least one guide plate arranged to reinforce the plurality of probes.

17. The apparatus of claim 15, wherein each of the plurality of probes has a length ranging from about 0.25 mm to about 2 mm.

18. The apparatus of claim 15, further comprising a conveyer configured to reposition each of the dies proximate the test head.

19. The apparatus of claim 15, wherein the die is an embedded multi-die interconnect bridge.

* * * * *

UNITED STATES PATENT AND TRADEMARK OFFICE
CERTIFICATE OF CORRECTION

PATENT NO. : 10,429,439 B2
APPLICATION NO. : 15/201315
DATED : October 1, 2019
INVENTOR(S) : Kim et al.

Page 1 of 1

It is certified that error appears in the above-identified patent and that said Letters Patent is hereby corrected as shown below:

In the Claims

Column 8, Line 66, in Claim 1, delete "then" and insert --when-- therefor

Column 9, Line 55, in Claim 10, delete "humps" and insert --bumps-- therefor

Signed and Sealed this
Nineteenth Day of May, 2020

Andrei Iancu
*Director of the United States Patent and Trademark Office*